United States Patent
Hirakawa

[11] Patent Number: 5,919,321
[45] Date of Patent: Jul. 6, 1999

[54] TARGET MATERIAL OF METAL SILICIDE

[75] Inventor: Eiji Hirakawa, Yasugi, Japan

[73] Assignee: Hitachi Metals, Ltd., Tokyo, Japan

[21] Appl. No.: 08/872,142

[22] Filed: Jun. 10, 1997

[30] Foreign Application Priority Data

Aug. 13, 1996 [JP] Japan .................................. 8-231302

[51] Int. Cl.$^6$ .......................... C22C 27/04; C22C 22/06
[52] U.S. Cl. .......................... 148/423; 420/429; 420/430
[58] Field of Search .................... 148/423; 420/429, 420/430, 431, 432

[56] References Cited

U.S. PATENT DOCUMENTS

| | | | |
|---|---|---|---|
| 3,688,018 | 8/1972 | Hiscocks .................. | 420/429 |
| 3,754,168 | 8/1973 | Cunningham et al. ........ | 420/429 |
| 4,619,695 | 10/1986 | Oikawa et al. ............ | 420/429 |
| 4,721,991 | 1/1988 | Ohtaki et al. ............. | 420/429 |
| 5,013,526 | 5/1991 | Kobayashi et al. ......... | 420/429 |
| 5,595,616 | 1/1997 | Berczik .................. | 420/429 |

FOREIGN PATENT DOCUMENTS

| | | |
|---|---|---|
| 61-141673 | 6/1986 | Japan . |
| 61-145828 | 7/1986 | Japan . |
| 63-219580 | 9/1988 | Japan . |
| 6-41629 | 6/1994 | Japan . |
| 8-49068 | 2/1996 | Japan . |

*Primary Examiner*—John Sheehan
*Attorney, Agent, or Firm*—Sughrue, Mion, Zinn Macpeak & Seas, PLLC

[57] ABSTRACT

A novel metal silicide target material is provided which can effectively restrict the occurrence of fine particles. The target material has a structure comprising metal silicide and free silicon, which material has a relative density more than 100% which relative density is defined by a ratio of a true density of the target material to a theoretical density obtained by calculation, and free silicon portions in the structure of the target material which free silicon portions are provided with Vickers hardness less than 1,100 or which free silicon portions are provided with dislocation-undetectable areas each having a diameter not less than 1 $\mu$m. Further, it is desirable that a rupture load evaluated by acoustic emission at which rupture load there occurs rupture in a scratching test of the surface of target material by acoustic emission is not less than 50N.

15 Claims, 7 Drawing Sheets

TARGET MATERIAL OF METAL SILICIDE

BACKGROUND OF THE INVENTION

This invention relates to the metal silicide target material used for forming electrodes or wiring, etc. in semiconductor devices.

Recently the metal silicide films such as films of tungsten silicide or molybdenum silicide, etc. are used for the electrodes and wiring in LSI because of large integration of the LSI.

Sputtering, chemical vapor deposition processes, etc. are used for forming these silicide films and especially the sputtering process becomes a mainstream because of the productivity and reproducibility of the films and the safety of operation. The sputtering process is a method of forming the thin film of fine substance discharged by the collision of inert gas ions such as those of argon against the surface of target material constituted by metal and silicon.

Since high stress is generated in the metal silicide film if the stoichiometric compositions are used to form the metal silicide $MSi_2$ with respect to the specific compositions of a target material, the target material containing a silicon content higher than that of the stoichiometric compositions within a scope not to increase its sheet resistance is usually used.

Furthermore, in case of the target material explained above a process to manufacture the target material of high density and less impurity has been researched for the purposes of preventing cracks from being generated during its use, uniformity of a thin film, achievement of low resistivity and avoiding the occurrence of "particles" caused by spotting electric discharge during sputtering, wherein in the field of sputtering the "particles" are used to mean coarse particulate substance adhered onto a thin film to be produced, and the occurrence of the particles on the thin film makes the thin film inferior. For example, in a case where a circuit pattern is formed by use of a thin film, the occurrence of the particles having a size exceeding the width of wiring causes the breakage of wiring, which is a serious problem concerning a semiconductor device.

For example, in JP-A-61-145828 there is disclosed a process to produce a silicide product formed by a melting process having steps of mixing both high purity and refractory metal powder and high purity silicon powder to thereby form a mixture, pressure-compacting the mixture to form a compact, heating and sintering the compact to thereby form a sintered body, and electron-beam-melting the sintered body.

Furthermore, in JP-A-61-141673 or JP-A-61-141674 there is disclosed a high density target material obtained by a process having the steps of mixing molybdenum powder or tungsten powder, compacting, forming silicide, breaking silicide pellet, and hot-pressing to thereby form a sintered body.

Moreover, as disclosed in publication No. JP-A-63-219580, in order to make a structure fine in size, there is proposed a process having the steps of performing the silicide reaction of silicon powder with the high melting point metal powder such as molybdenum, tungsten powder, etc. in vacuum to thereby make a calcined mass, and performing the hot isostatic press of the calcined mass.

Further, as described in publication No. JP-A6-41629, paying attention to the respect that the content of carbon relates to decrease in the occurrence of particles, there is disclosed a method additionally having a step of reducing both carbon and oxygen by heating in high vacuum a mixture which had been prepared by mixing metal powder and silicon powder.

In addition, as described in publication No. JP-A-8-49068, this applicant proposes a process in which the relative density of a calcined mass is made to be not less than 101% by sintering it at a high temperature of 1,200 to 1,400° C. and under high pressure not less than 110 MPa.

The above explained densifying, the reducing of the impurities, and making the structure fine in size are means effective to decrease the occurrence of particles in metal silicide target materials such as molybdenum silicide or tungsten silicide, etc.

However, recently the integration in LSI is so significantly high as to decrease the width of thin films required for wiring, etc. down to the order of submicron with the result that even fine particles which were conventionally out of the question now becomes a problem awaiting solution.

According to the examination of the occurrence of particles regarding a target material obtained by use of the process proposed by this applicant and described in the above publication No. JP-A-8-49068, the significant decrease in the occurrence of particles not less than 0.3 μm in size was able to be confirmed.

However, in such a severe case as to evaluate the occurrence number of particles not less than 0.2 μm, it was found that the decrease was insufficient.

SUMMARY OF THE INVENTION

The object of this invention is to provide a novel metal silicide target material making it possible to effectively restrict the occurrence of especially small size particles to thereby meet the above requirements.

The present inventors researched in detail a relation between the structure of target material and the occurrence of particles, after having noticed that, in case of the target material having an atomic ratio Si/M of silicon to metal M which atomic ratio is greater than 2 and a structure substantially comprising a metal silicide compound and free silicon portions, only the densifying of the target material which densifying is performed to restrict the occurrence of the particles is not enough to restrict the occurrence of particles small in size and a new technique in addition to the densifying is required.

As the result, it was found that the occurrence of the small size particles depends on the internal conditions such as the strain, dislocation, etc. in the structure which constitutes the above target material, and especially depends on the internal state of free silicon.

Then, the inventors noticed that the hardness of free silicon reflected the internal state of free silicon and that, by decreasing the hardness of the free silicon portions, the occurrence of small size particles was able to be restricted.

In other words, the invention relates to a metal silicide target material having a relative density more than 100% which relative density is defined by a ratio of a true density of the target material to a theoretical density obtained by calculating on the assumption that the target material is constituted by both stoichiometric silicide $MSi_2$ of high melting point and pure silicon Si, the free silicon portions in the structure of the target material being provided with Vickers hardness less than 1,100.

Further, the inventors noticed that the density of dislocation in the structure of free silicon portion was an index which directly indicates the internal state of free silicon, and that the decrease in the amount of dislocation detected in the structure of free silicon is effective to decrease the occurrence of particles small in size.

The target material of the invention viewed from the respect of dislocation density is a metal silicide target material having a relative density more than 100% which relative density is defined by a ratio of a true density of the target material to a theoretical density obtained by calculating on the assumption that the target material is constituted by both stoichiometric silicide $MSi_2$ of high melting point and pure silicon Si, the free silicon portions in the structure of the target material being provided with dislocation-undetectable areas each having a diameter not less than 1 $\mu$m.

In this case, the Vickers hardness of the free silicon portion in the structure of the target material is preferably less than 1,100.

In the target material of the invention, the Vickers hardness of the metal silicide portion in the structure of the target material is preferably less than 1,200.

Further, in the target material of the invention a scratching rupture load at which rupture occurs is preferably not less than 50N in a case where a load is successively increased from zero N at a scratching rate of 10 mm/min. at a loading rate of 100N/min. by use of a diamond indentor used for Rockwell hardness A scale.

PREFERRED EMBODIMENTS OF THE INVENTION

In the invention, it is required to control the relative density to be higher than 100% so as to restrict the occurrence of coarse particles.

This is because vacancies in the target material of low density cause abnormal electric discharge during sputtering and become the cause of the occurrence of coarse particles.

In the target material of this high density, the significant feature of the invention resides in prescribing the internal states such as strain, dislocation, etc. of the structure constituting the target material, especially the internal state of free silicon so as to prevent small size particles from occurring.

The detailed description is explained below.

As for conditions for producing the target material, the inventors examined the target materials made of various raw material grain sizes and pressure sintering conditions, and the occurrence of particles having small particle size.

As the results, even in a case of no difference in microstructures at a glance, the existence of the target material with less occurrence of small size particles was found.

Then, during the detailed research of the phenomenon, the inventors have found that in the target material with less occurrence of small size particles the hardness of free silicon portions was significantly low as compared with that of the target material of much occurrence of small size particles.

Therefore, in the invention, the Vickers hardness of the free silicon portion is prescribed to be less than 1,100.

The reason why the Vickers hardness is limited to be less than 1,100 in this invention is that the occurrence of small size particles can be apparently decreased in this range of hardness as compared with the conventional materials of high density.

Then, further examination of target material of less occurrence of particles by use of a transmission electron microscope revealed that the strain, stacking faults and/or dislocation in free silicon portions of the target material of less particle occurrence is less as compared with those in the target material of much particle occurrence. In other words, the above hardness in the free silicon portions reflects the internal state of such structures.

To more clearly define the target material described above in the invention, it is found that the free silicon portions in the structure of the target material have dislocation-undetectable areas each having a diameter not less than 1 $\mu$m.

Because of the difficulty of quantitatively evaluating the internal state such as strain, dislocation, etc. and in order to quantitatively evaluate dislocation which is relatively readily detected, the size of dislocation-undetectable areas is prescribed.

Specifically, an example of the target material of tungsten silicide with the composition of WSix (x=2.75) is explained below.

Figure 1:
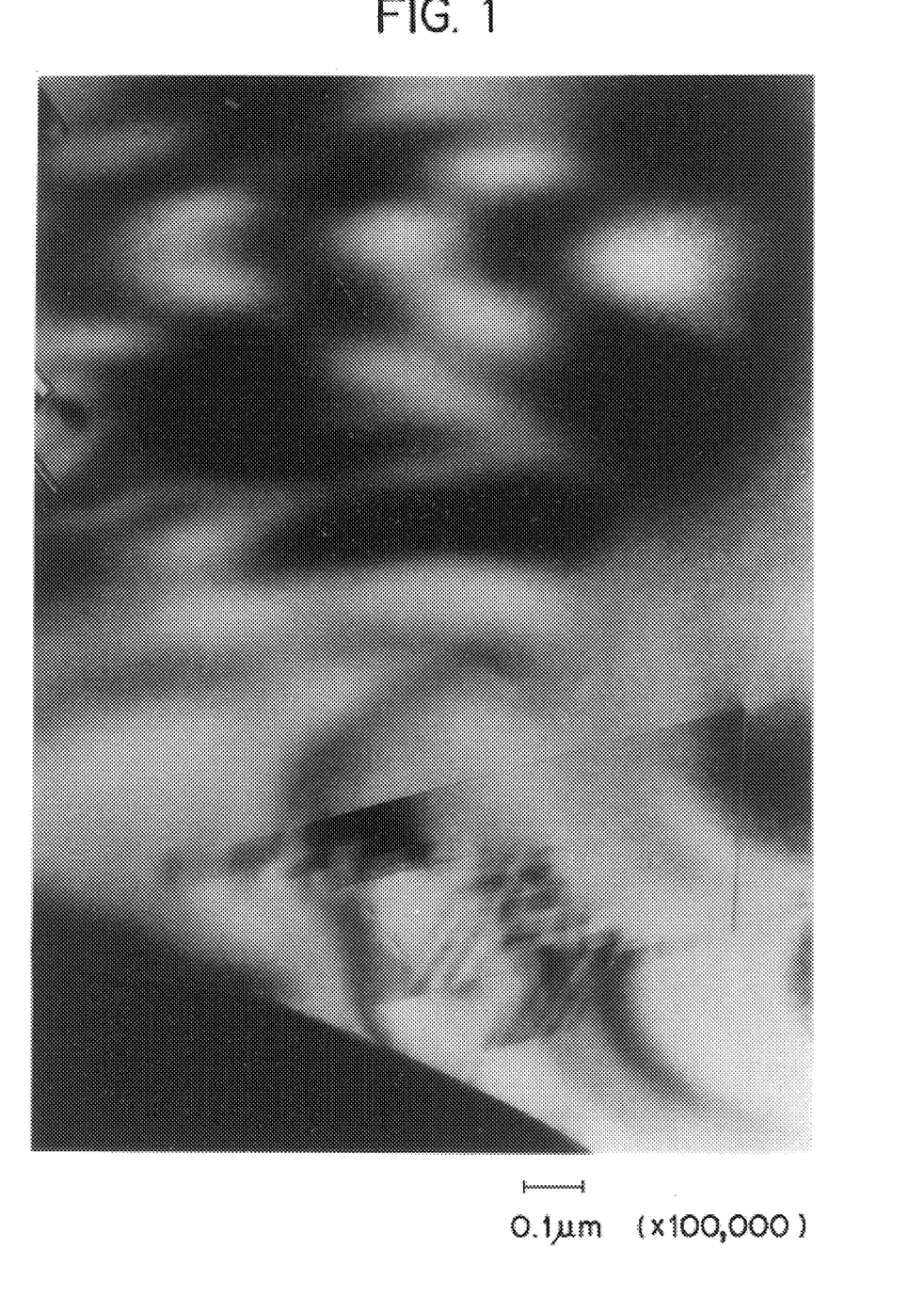
FIG. 1 is a photograph of transmission-electron-microscopic microstructure of 100,000 magnification regarding the target material of the invention.
Figure 2:
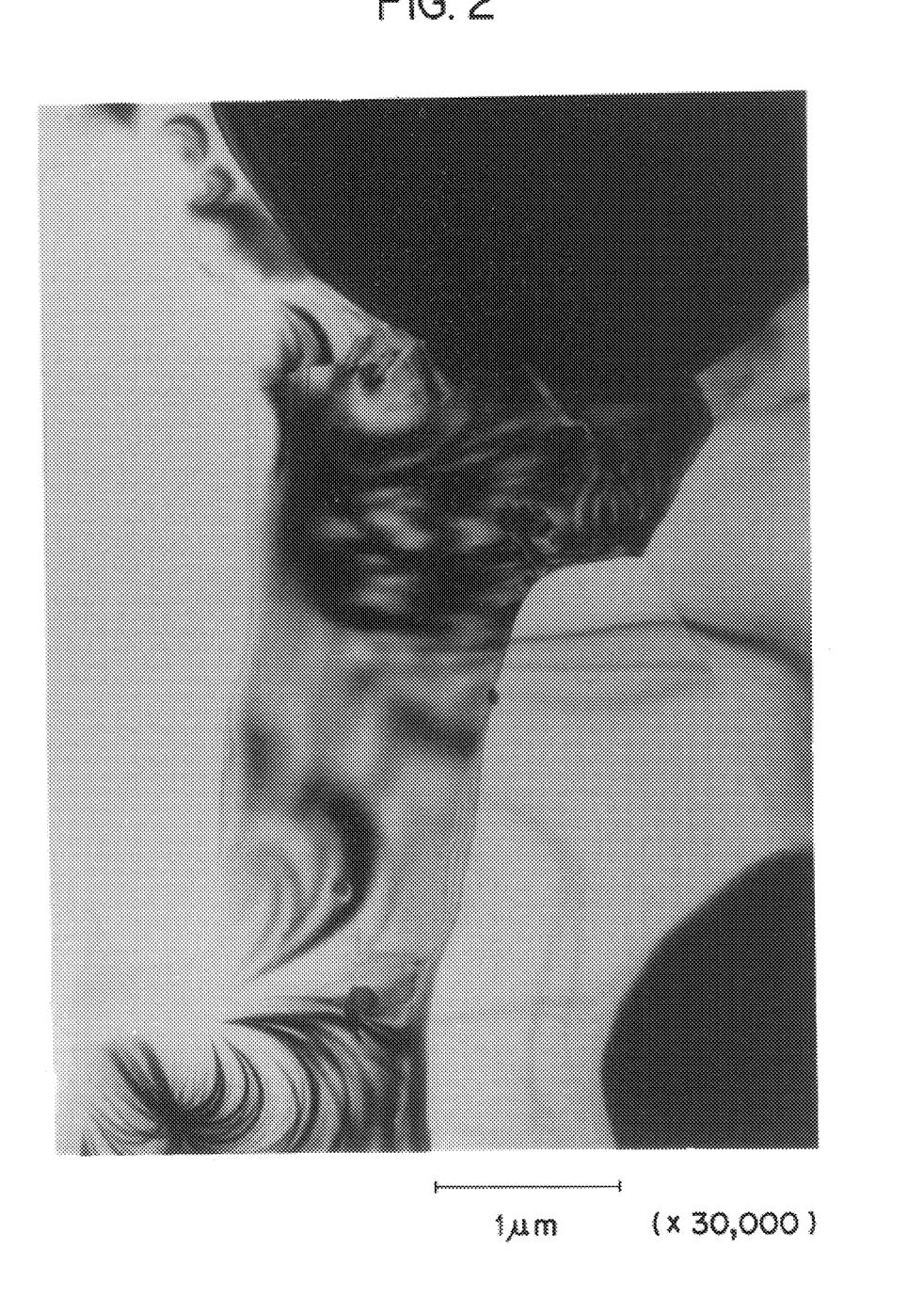
FIG. 2 is a photograph of transmission-electron-microscopic microstructure of 30,000 magnifications regarding the target material of the invention.

Both FIG. 1 and FIG. 2 are the transmission-electron-microscopic photographs of free silicon portions in the tungsten silicide of 102% relative density with the magnification of 100,000 and 30,000, respectively, regarding the target material of the invention, and black color particles show tungsten silicide portions with the white color parts showing free silicon portions.

Figure 3:
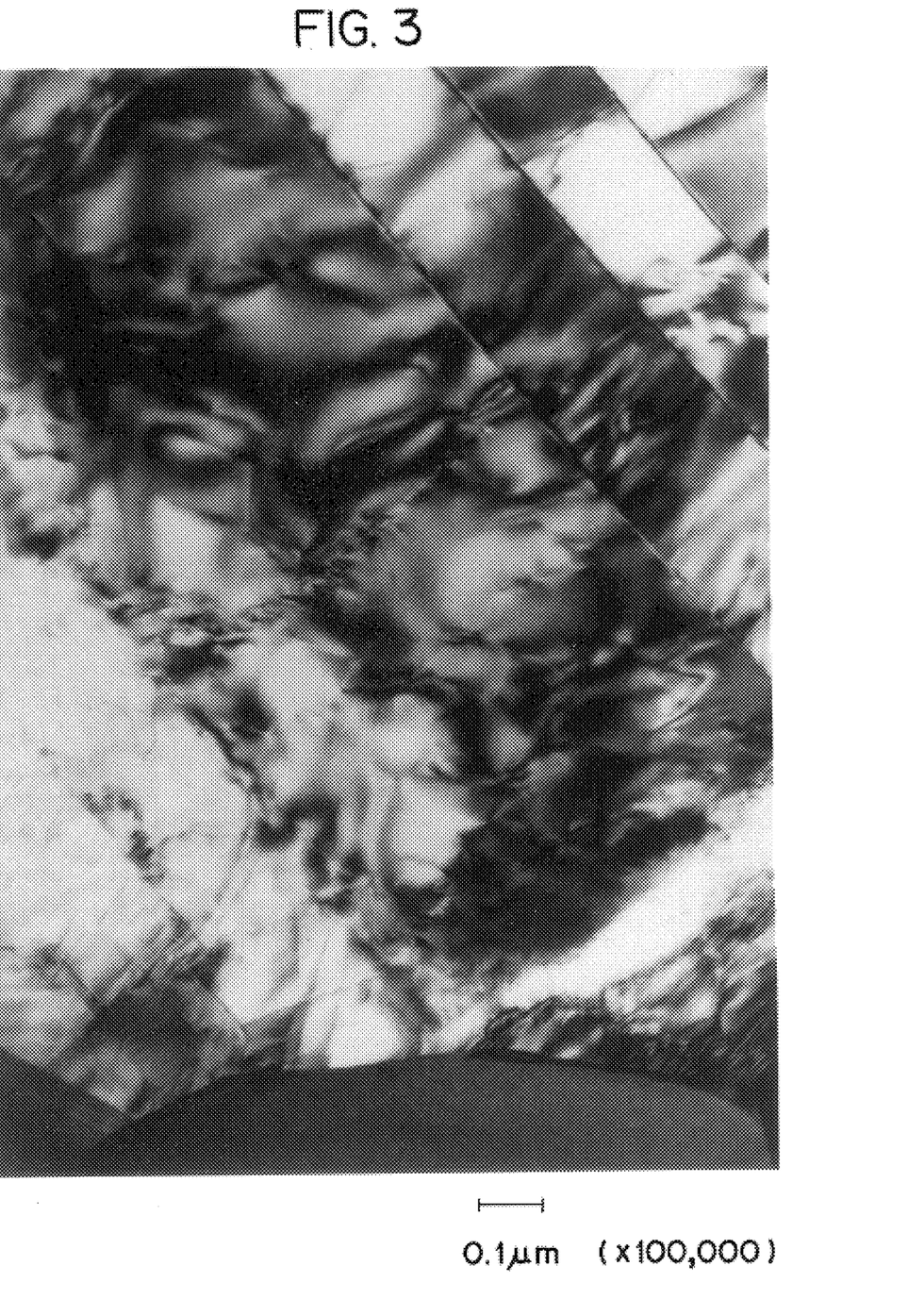
FIG. 3 is a photograph of transmission-electron-microscopic microstructure of 100,000 magnifications regarding the target material for comparison.
Figure 4:
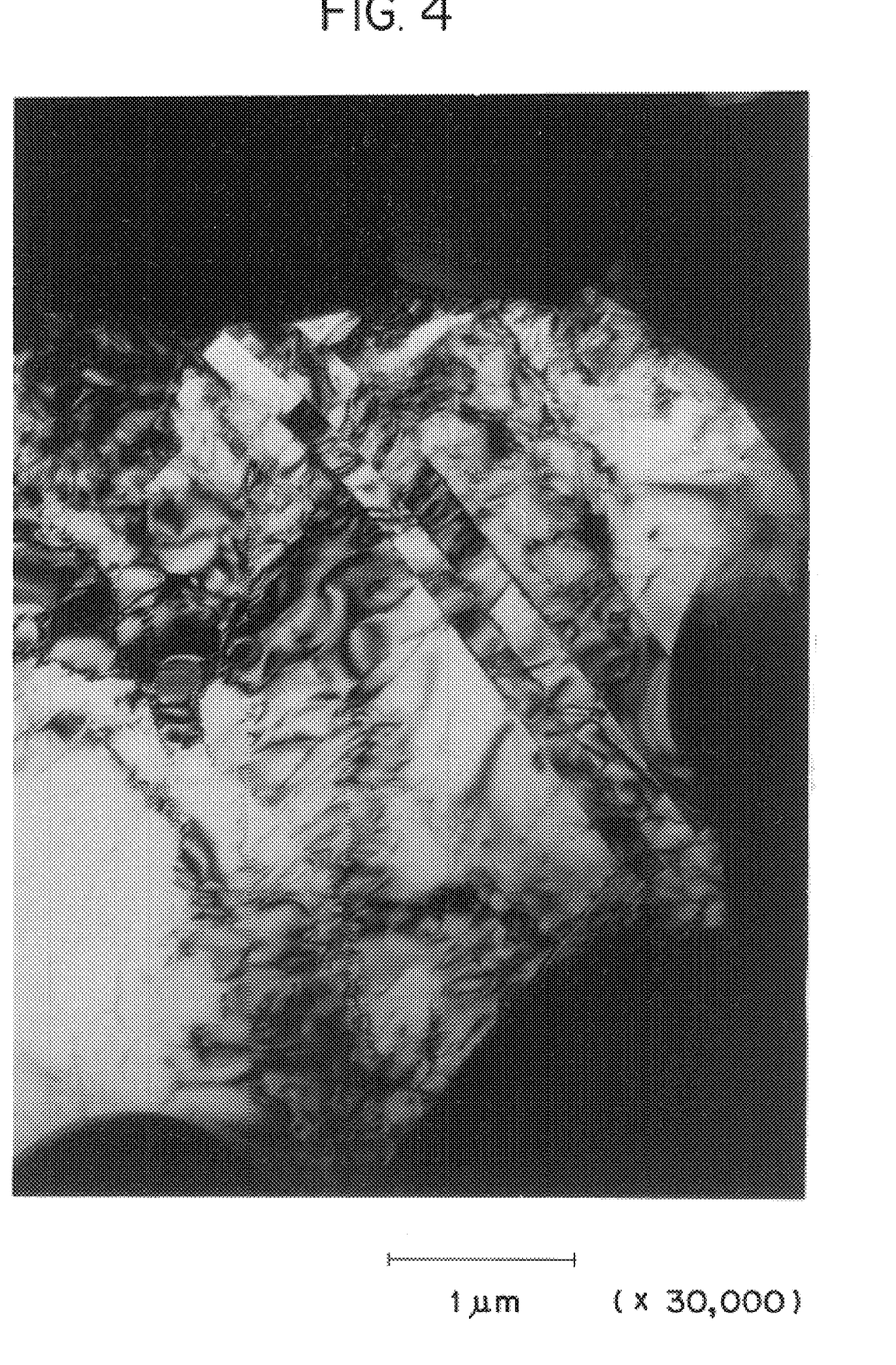
FIG. 4 is a photograph of transmission-electron-microscopic microstructure of 30,000 magnifications regarding the target material for comparison.

On the other hand, as for examples for comparison, both FIG. 3 and FIG. 4 are the transmission-electron-microscopic photographs of free silicon portions in the tungsten silicide of 102% relative density with the magnification of 100,000 and 30,000, respectively.

In FIGS. 1 and 2, although images considered to be twins can be seen, no image clearly indicating the existence of clear dislocation can be seen. On the other hand, dislocations which seem to be innumerable can be seen in both FIG. 3 and FIG. 4.

Then, as compared with the target material of the invention shown in both FIG. 1 and FIG. 2, the dislocation density in silicon portions in the comparison example is clearly higher.

For the sake of the quantitative evaluation of the dislocation density, the size of dislocation-undetectable areas is used. In other words, in the structures in both FIG. 1 and FIG. 2 each of the dislocation-undetectable areas has a diameter far larger than 1 μm, but in the structure in both FIG. 3 and FIG. 4 each of the dislocation-undetectable areas has a diameter not larger than 0.5 μm.

Because of the difference of structures such as this, the occurrence number of particles having sizes not less than 2 μm in the tungsten silicide embodying the invention was able to be reduced down to one third or less that of the target material for comparison.

The target material with free silicon portions having low hardness and low dislocation density both realized in this invention can be produced by a process having the steps of reducing the average grain size of metal powder (such a metal powder to make, for example, metal silicide as tungsten, molybdenum powder, etc.) to 50 μm or less, using extremely fine silicon powder of average grain size not more than 5 μm together with the above metal powder as raw material powders, heating them for performing silicide-forming reaction to make a calcined mass, performing pulverizing, and then sintering it at a temperature of 1,200° C. or higher and at a pressure between 40 and 100 MPa.

By using the fine raw material powder such as this, without applying high pressure 110 MPa or greater, it is possible for the target material of the invention to have relative density higher than 100% and to have Vickers hardness of free silicon portions less than 1,100.

Further, as a process to merely obtain high density, the conditions of both high temperature not less than 1,200° C. and high pressure more than 100 MPa can be applied as disclosed in JP-A-8-49068. However, since in this process high pressure is applied, the Vickers hardness (Hv) of free silicon portions in the target material structure increases to 1,100 or more and dislocation density becomes higher, which are not preferable.

Therefore, in a case of using this process, it is required to reduce the hardness of the free silicon portions by annealing the target material at a temperature not less than 1,200° C.

Incidentally, since in the target material structure of the invention each of the free silicon portions is encircled and constrained by the metal silicide, even in a case of applying the above annealing treatment, the decrease of hardness of the free silicon portions is only a little. Therefore, it is preferable to adopt the above process performing the sintering at the low pressure.

In case of trying to obtain such a metal silicide target material containing silicon in the state of free silicon by pressure sintering as in the present invention, the application of temperature not less than 1,200° C. is desirable to obtain the density more than 100% in relative density. In addition, it is preferable to limit the upper limit of the temperature to be not more than 1,400° C. which is lower than the melting point of Si (1,414° C.).

This is because, at a temperature more than 1,400° C., the structure of the sintered body becomes ununiform due to melting of silicon.

According to the inventors' examination, the Vickers hardness of the free silicon portions increases approximately in proportion to the rise in the pressure of sintering. In the invention, it is desirable to keep the pressure of sintering not more than 100 MPa for making the Vickers hardness less than 1,100.

In the invention, an atomic ratio Si/M of silicon to the refractory metal is limited to be more than 2. In a case where Si/M is not more than 2, the target material structure has no free silicon areas. In case of being used for electrodes or wiring in LSI, because of the problem of too high sheet resistance caused if a Si/M ratio is more than 4, it is desirable to keep Si/M not more than 4. Further, the more the amount of the free silicon, the more the generation of particles caused by either the hardness of or dislocation density in the free silicon portion becomes thus, in the invention, more advantage can be brought about with respect to a target material having Si/M ratio not less than 2.5.

Although the reason why in the invention the occurrence of small size particles is affected by the hardness of or dislocation density in free silicon portion is not clearly found, the present inventors have determined that the brittleness of sputtered surface portion on the target material becomes one of the causes.

As the results of the inventors' examination, in the scratching test in which a simple load is applied on the sputtered surface of target material, it was observed that the comparison target material having more particles occurring had a tendency to increase the scratched width.

For the quantitative evaluation thereof, as means to measure a load required for rupture occurring in the scratching test, a method to measure what is called acoustic emission was adopted.

Specifically, it has been found that the occurrence of small size particles significantly decreases when a rupture load at which the scratching rupture occurs is not less than 50N in a case where a load is successively increased from zero N at a scratching rate of 10 mm/min. and at a loading rate of 100N/min. by use of a diamond indentor used for Rockwell hardness A scale.

Figure 9:
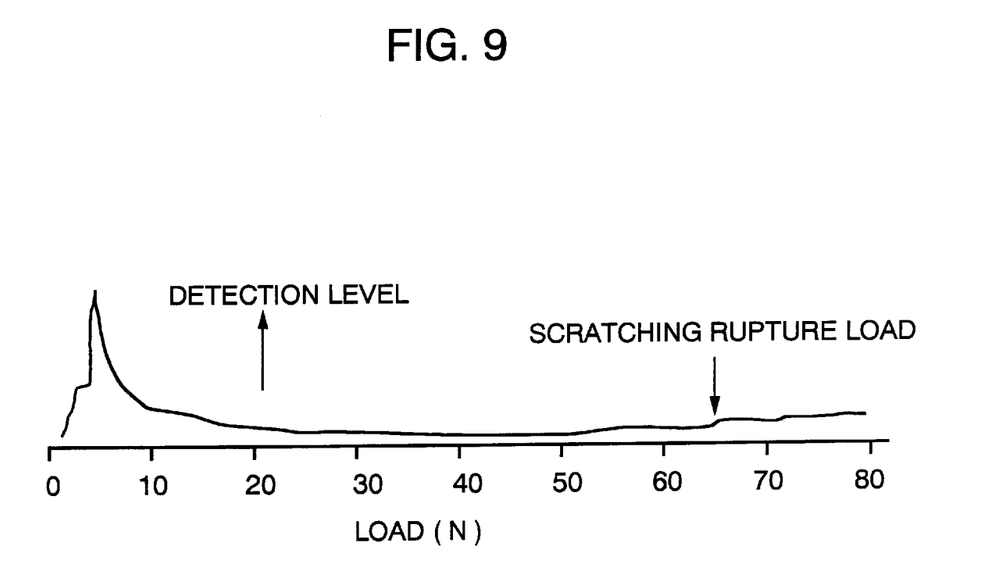
FIG. 9 is a graph showing an example of measuring a scratching rupture load by acoustic emission.

In actual measurement, the scratching rupture loads by acoustic emission were detected as relative values. The examples are shown in FIG. 9, in which the scratching rupture load is shown which is defined by a detection level at which a detected value begins to suddenly increase when a load is increased, while excluding fluctuated values occurring at the initial stage (Refer to FIG. 9). The ordinate in FIG. 9 shows relative values detected.

When producing the target material of the invention, it is possible to use silicide-forming reaction. This reaction is a reaction in which molybdenum or tungsten, etc. reacts with silicon to become a metal silicide.

In a case where the atomic ratio Si/M of silicon to metal M is adjusted to be more than 2, which means the excess of Si in comparison with the Si amount in stoichiometric silicide $MSi_2$, there occurs a structure having free silicon which did not take part in the reaction of metal silicide.

The theoretical density in this invention is defined to be a density value obtained by calculating on the assumption that each of stoichiometric metal silicide $MSi_2$ and pure silicon Si independently exists in the structure of target material. A specific method of the calculation is described below.

The structure of target material in this invention is constituted by metal silicide (which is a compound) and free silicon as described above.

Figure 5:
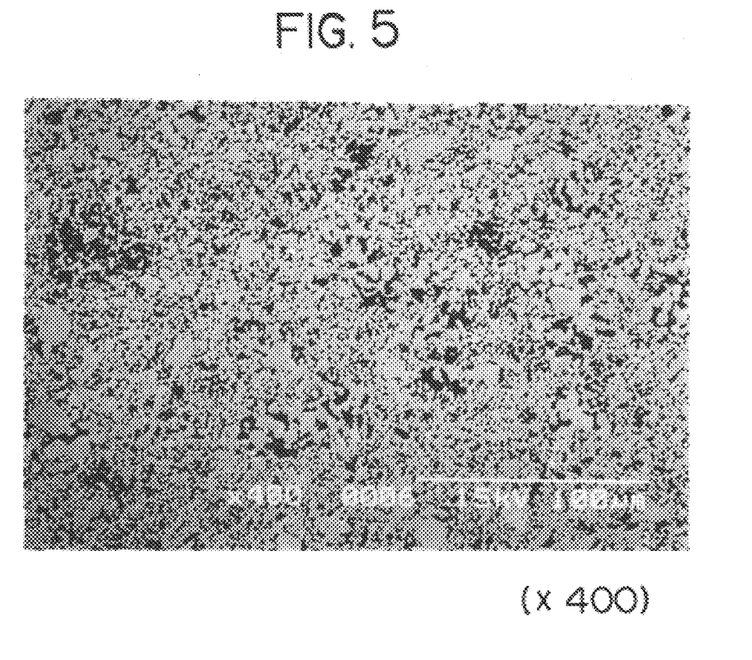
FIG. 5 is a photograph of microstructure to show an example of the structure of tungsten silicide target material of the invention.
Figure 7:
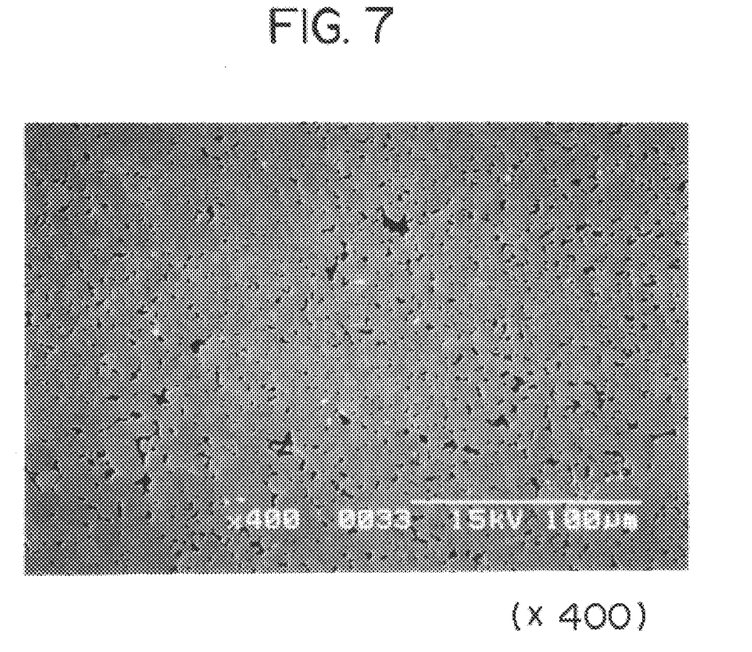
FIG. 7 is a photograph of microstructure showing an example of the structure of molybdenum silicide target material of the invention.

Therefore, the structure is made of such a compound phase as shown in the embodiment of FIG. 5 where M is tungsten or as shown in FIG. 7 where M is molybdenum. As shown in both FIG. 5 and FIG. 7, the structure is constituted by white portions corresponding to metal silicide and dark or black portions corresponding to free silicon.

In the structure of target material of the invention shown in both FIG. 5 and FIG. 7, the free silicon portions are finely distributed with a size corresponding to an equivalent circle having a diameter not more than 5 μm. Because of this, the target material of high density in excess of 100% in relative density can be produced.

The theoretical density in this invention can be calculated as shown in the following.

In case of the target material with atomic ratio Si/M=2.75 of silicon to tungsten, both the density and molecular weight of stoichiometric tungsten silicide $WSi_2$ are as shown in the following:

| Density | 9.83 [g/cm³] and |
| Molecular weight | 240.022 [g/g-mol]. |

Both the density and molecular weight of pure silicon are as shown in the following:

| Density | 2.33 [g/cm³] and |
| Molecular weight | 28.086 [g/g-mol]. |

Provided that the target material is substantially constituted only by $WSi_2$: 1 [g-mol] and Si: 0.75 [g-mol], the weight of the target material is (1[g-mol]X240.022[g/g-mol])+(0.75[g-mol]X28.086[g/g-mol]) =261.85[g]

The volume of the target material is (1[g-mol]X240.022[g/g-mol]/9.83[g/cm³])+(0.75[g-mol]X28.086[g/g-mol]/2.33[g/cm³])=33.458[cm³].

The density at this case becomes (the weight of target material)/(the volume of target material)=7.803 [g/cm³]. This is a theoretical density.

On the other hand, a true density can be obtained to measure the volume of target material by the Archimedes' principle and to weigh it.

If the true density obtained by this is, for example, 7.90 [g/cm³], a relative density is (True densityX100)/Theoretical density=(7.90[g/cm³]X100)/7.803[g/cm³]=101.2%.

Embodiment 1

Both high purity tungsten powder (purity not less than 99.999% and average particle size of 4.8 μm) and high purity silicon powder (purity not less than 99.999% and average particle size of 2 μm) were weighed to become a ratio of Si/W=2.75, and mixed with a blender. A theoretical density in this case calculated by the above method is 7.803 [g/cm³].

A calcined mass was obtained by the silicide reaction of the mixed powder which reaction was performed at the conditions of 1,350° C.X2hr and at a high vacuum not more than $6 \times 10^{-2}$ Pa. By use of a method having the steps of pulverizing the calcined mass to a particle size not larger than 100 mesh (150 μm) in an argon gas atmosphere, then heating and sintering them with a hot-isostatic press in the conditions shown in Table 1, and machining the sintered material, a tungsten silicide target material of 300 mm in diameter was obtained.

A true density was obtained by the Archimedes' method. Both true density obtained and relative density calculated by true and theoretical densities are shown in Table 1.

TABLE 1

| Specimen | Temperature ° C. | Pressure MPa | True density g/cm³ | Relative density % | Remarks |
|---|---|---|---|---|---|
| 1 | 1,250 | 75 | 7.89 | 101.1 | Example of the invention |
| 2 | 1,300 | 65 | 7.97 | 102.1 | Example of the invention |
| 3 | 1,320 | 62 | 7.98 | 102.3 | Example of the invention |
| 4 | 1,340 | 58 | 7.99 | 102.4 | Example of the invention |
| 5 | 1,360 | 56 | 8.00 | 102.5 | Example of the invention |
| 6 | 1,380 | 48 | 7.99 | 102.4 | Example of the invention |
| 7 | 1,250 | 125 | 7.94 | 101.7 | Example for comparison |
| 8 | 1,300 | 150 | 8.00 | 102.5 | Example for comparison |
| 9 | 1,300 | 180 | 8.02 | 102.8 | Example for comparison |
| 10 | 1,100 | 75 | 7.71 | 98.8 | Example for comparison |

The hardness of both the free silicon and metal silicide portions of the obtained target material were measured with a Vickers hardness tester of 50 kg load.

Further, a rupture load (a scratching rupture load) at which rupture occurs was detected by using acoustic emission in a case where a load was successively increased from zero N at a scratching rate of 10 mm/min. and at a loading rate of 100N/min. by use of a diamond indentor used for Rockwell hardness A scale.

In addition, by observing the structures in the magnification of 30,000 in optional 10 visual fields with a transmission electron microscope, the extent of dislocation-undetectable areas (the diameters of dislocation-undetectable areas) was observed.

Then, after sputtering with the tungsten silicide target material obtained in the conditions shown in Table 3, the number of respective particles not less than 0.3 μm and not less than 0.2 μm which occurred on a 6 inch wafer was measured. The results are shown in Table 3.

TABLE 2

| Specimen | Hardness of Si portion Hv | Hardness of $WSi_2$ portion Hv | Scratching rupture load N | Size of dislocation-free area μm | Number of particles (pieces/wafer) | | Remarks |
|---|---|---|---|---|---|---|---|
| | | | | | ≧2 μm | ≧3 μm | |
| 1 | 1050 | 1100 | 65 | >1 | 25 | 7 | Example of the invention |
| 2 | 1010 | 1090 | 67 | >1 | 24 | 7 | Example of |

TABLE 2-continued

| Speci-men | Hardness of Si portion Hv | Hardness of WSi$_2$ portion Hv | Scratching rapture load N | Size of dislocation-free area μm | Number of particles (pieces/wafer) ≧2 μm | ≧3 μm | Remarks |
|---|---|---|---|---|---|---|---|
| 3 | 1005 | 1085 | 75 | >1 | 22 | 6 | Example of the invention |
| 4 | 985 | 1070 | 85 | >1 | 19 | 6 | Example of the invention |
| 5 | 980 | 1065 | 88 | >1 | 15 | 5 | Example of the invention |
| 6 | 950 | 1060 | 86 | >1 | 18 | 5 | Example of the invention |
| 7 | 1250 | 1150 | 47 | 0.5 | 82 | 8 | Example for comparison |
| 8 | 1300 | 1180 | 45 | 0.4 | 93 | 10 | Example for comparison |
| 9 | 1500 | 1210 | 38 | 0.4 | 95 | 9 | Example for comparison |
| 10 | 1045 | 1120 | 61 | >1 | 105 | 82 | Example for comparison |

TABLE 3

| Item | Film forming conditions |
|---|---|
| Temperature of substrate | No heating |
| Vacuum attained | <3.0 × 10$^{-4}$ Pa |
| Composition of gas | 100% Ar |
| Film thickness | 20 nm |

A typical structure photograph of tungsten silicide target material of the invention in the magnification of 400 is shown in FIG. 5.

In FIG. 5, white color parts are tungsten silicide compound portions, black color parts being free silicon portions in the tungsten silicide target material, both of which silicide and free silicon are dispersed in the structure.

Specimens 1 to 6 among the specimens shown in both Table 1 and Table 2 are the target materials of the invention and specimens 7 to 10 are the target materials for comparison.

Figure 6:
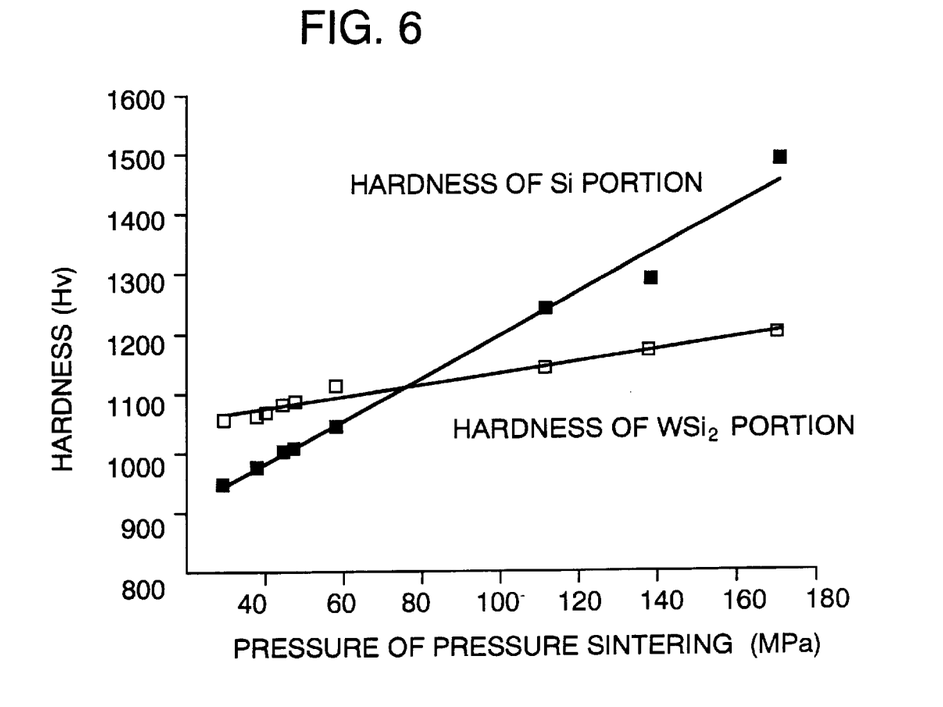
FIG. 6 is a graph showing a relation between the pressure of pressure sintering and the hardness of free silicon portion in tungsten silicide target material.

The relation between the pressure of the pressure sintering in hot-isostatic pressing process and the hardnesses of both Si and WSi$_2$ portions in a resultant target material is shown in FIG. 6.

As shown in FIG. 6, the hardnesses of both Si and WSi$_2$ portions increase in proportion to the pressure increase of pressure sintering. For example, at the 180 MPa pressure of the pressure sintering, the hardness of Si portion increases to 1,500 Hv and the same of WSi$_2$ portion 1,210 Hv. Furthermore, it is noted that as shown in FIG. 6, especially the hardness increase of Si portion is significant as compared with that of WSi$_2$ portion.

It is found that, as shown in Table 2, in the target materials of the invention in which the Vickers hardness of the free silicon portion is restrained to be less than 1,100, the occurrence of particles of small sizes was significantly decreased in comparison with the target materials of specimens 7 to 9 for comparison having the free silicon portion of the Vickers hardness not less than 1,200.

Further, in Table 2, judging from the scratching rupture loads evaluated by acoustic emission, it is found that there is such a tendency as the lower the scratching rupture load is, the more the number of occurrence of fine particles in the target material becomes.

In the target materials of the invention in which the occurrence of fine particles is in a low level, the scratching rupture loads of each of them was not less than 50N.

In addition, as the results of observation of dislocations with a transmission electron microscope, it was confirmed that the target materials of less occurrence of fine particles had smaller number of dislocation in their free silicon portions. In a case of the target materials of the invention, the diameter of dislocation-undetectable areas is in a comparatively large range not less than 1 μm, but in another case of the target materials for comparison with much occurrence of fine particles, the diameter of dislocation-undetectable areas is not more than 0.5 μm.

Since specimen 10 among the target materials for comparison was sintered at low temperature, the relative density thereof became only 98.8% and, as a whole, the occurrence of particles increased unpreferably in spite of comparatively large dislocation-undetectable areas.

Embodiment 2

Both high purity molybdenum powder (purity not less than 99.999% and average particle size of 4.2 μm) and high purity silicon powder (purity not less than 99.999% and average particle size of 2 μm) were weighed at the ratio of Si/W=2.3 and mixed with a blender. The theoretical density at this case calculated by the above method is 5.734 [g/cm$^3$].

A calcined mass was obtained by the silicide reaction of the above mixed powders which reaction was performed under the conditions of 1,200° C.X4hr and at a high vacuum not less than 6×10$^{-2}$ Pa. By use of the steps of pulverizing the calcined mass into a size not larger than 100 mesh (150 μm) in an argon gas atmosphere, then heating and sintering them with a hot-isostatic press in the conditions shown in Table 3 and machining the sintered material, a molybdenum silicide target material of 300 mm in diameter was obtained.

A true density was obtained by the Archimedes' method. Both true density obtained and relative density calculated by true and theoretical densities are shown in Table 4.

TABLE 4

| Specimen | Temperature °C. | Pressure MPa | True density g/cm³ | Relative density % | Remarks |
|---|---|---|---|---|---|
| 11 | 1,250 | 75 | 5.79 | 101.1 | Example of the invention |
| 12 | 1,300 | 65 | 5.81 | 101.3 | Example of the invention |
| 13 | 1,320 | 62 | 5.82 | 101.5 | Example of the invention |
| 14 | 1,340 | 58 | 5.83 | 101.6 | Example of the invention |
| 15 | 1,360 | 56 | 5.81 | 101.3 | Example of the invention |
| 16 | 1,380 | 48 | 5.80 | 101.1 | Example of the invention |
| 17 | 1,250 | 125 | 5.82 | 101.5 | Example for comparison |
| 18 | 1,300 | 150 | 5.83 | 102.6 | Example for comparison |
| 19 | 1,300 | 180 | 5.84 | 101.8 | Example for comparison |
| 20 | 1,100 | 75 | 5.65 | 98.5 | Example for comparison |

TABLE 5

| Specimen | Hardness of Si portion Hv | Hardness of MoSi₂ Hv | Scratching rapture load N | Diameter of dislocation-undetected area μm | Number of particles (pieces/wafer) ≧2 μm | ≧3 μm | Remarks |
|---|---|---|---|---|---|---|---|
| 11 | 987 | 995 | 64 | >1 | 26 | 9 | Example of the invention |
| 12 | 983 | 993 | 66 | >1 | 23 | 8 | Example of the invention |
| 13 | 972 | 987 | 73 | >1 | 21 | 8 | Example of the invention |
| 14 | 960 | 985 | 86 | >1 | 18 | 7 | Example of the invention |
| 15 | 953 | 972 | 91 | >1 | 14 | 5 | Example of the invention |
| 16 | 945 | 968 | 92 | >1 | 17 | 5 | Example of the invention |
| 17 | 1120 | 1053 | 46 | 0.7 | 53 | 8 | Example for comparison |
| 18 | 1172 | 1074 | 44 | 0.5 | 75 | 8 | Example for comparison |
| 19 | 1226 | 1097 | 39 | 0.4 | 77 | 9 | Example for comparison |
| 20 | 983 | 989 | 62 | >1 | 112 | 80 | Example for comparison |

The hardnesses of both the free silicon and the metal silicide portions in the obtained target material were measured with a Vickers hardness tester of 50 kg load.

Further, a rupture load (a scratching rupture load) at which rupture occurred was detected by acoustic emission by use of a scratching test having the step of successively increasing a load from zero N at a scratching rate of 10 mm/min. and at a loading rate of 100N/min. while using a diamond indentor used for Rockwell hardness A scale.

In addition, by observing the structures in the magnification of 30,000 in arbitrary 10 visual fields with a transmission electron microscope, the extent of dislocation-undetectable areas (the diameters of dislocation-undetectable areas) was observed.

Then, after performing sputtering on the molybdenum silicide target material obtained in the conditions shown in Table 3, the number of respective particles not less than both 0.3 μm and not less than 0.2 μm occurred on a 6 inch wafer was measured. The results are shown in Table 5.

Further, a typical structure photograph of molybdenum silicide target material of this invention in the magnification of 400 is shown in FIG. 7. In the molybdenum silicide target material in FIG. 7, the white color parts are molybdenum silicide compound portions, the black color parts are free silicon portions, both of which silicide compound and free silicon are dispersed in the structure. It can be seen that the volume of the free silicon in the whole structure is smaller than that of the tungsten silicide in Embodiment 1, which is caused by the small amount of silicon in view of Si/Mo=2.3.

Specimens 11 to 16 among the specimens shown in both Table 4 and Table 5 are the target materials of the invention and specimens 17 to 20 are the target materials for comparison.

Figure 8:
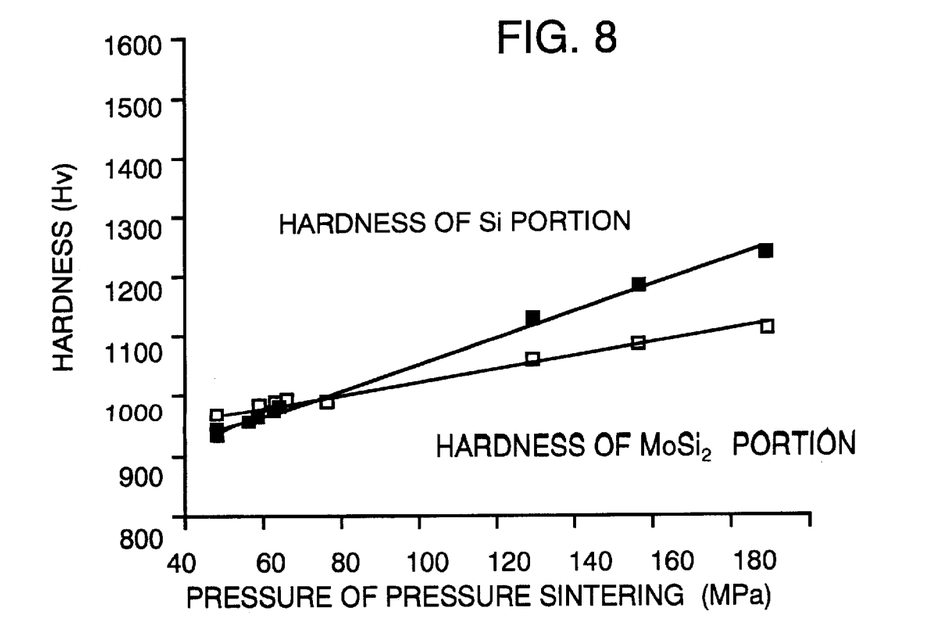
FIG. 8 is a graph showing a relation between the pressure of pressure sintering and the hardness of free silicon portion in molybdenum silicide target material.

From the data in Tables 4 and 5, there is obtained a relation shown in FIG. 8 between the pressure of pressure sintering in the hot-isostatic pressing process and the hardness of Si and MoSi₂ portions of the obtained target material.

As shown in FIG. 8, the hardness of both Si and MoSi₂ portions increases in proportion to the pressure increase of the pressure sintering. For example, at the 180 MPa pressure of the pressure sintering, the hardness of Si portion reaches 1,226 Hv and the same of MoSi₂ portion 1,097 Hv. Incidentally, it is noted that as shown in FIG. 8, especially the hardness increase of Si portion is large as compared with that of MoSi₂ portion. In the molybdenum silicide material, it is presumed that the hardness of Si portion in molybdenum silicide material did not increase so high as that in the tungsten silicide material because of the less free silicon content such as Si/Mo=2.3.

As shown in Table 5, the number of fine particles in the target materials of the invention in which the Vickers hardness of the free silicon portion was restricted to a level less than 1,100 was able to be significantly decreased as compared with the target materials for comparison, specimens 17 to 19 in which the free silicon portion had Vickers hardness not less than 1,100.

Further, in judging from the scratching rupture loads evaluated by acoustic emission, such a tendency can be seen as the lower the scratching rupture load is, the more the number of occurrence of fine particles in the target material becomes as shown in Table 5.

In case of all the target materials of decreased occurrence of fine particles in the invention, all of their scratching rupture loads were not less than 50N.

According to the observation of dislocations by use of a transmission electron microscope, it was confirmed that, also in the molybdenum target silicide material, the target materials of decreased occurrence of fine particles had smaller numbers of dislocation in their free silicon portions.

The target materials of the invention had such a large dislocation-undetectable areas as to have a diameter not less than 1 μm, but the target materials for comparison with much occurrence of fine particles had dislocation-undetectable areas each having a diameter less than 1 μm.

Incidentally, since specimen 20 among the target materials for comparison was sintered at the low temperature, the relative density became only 98.5% and there occurred much particles as a whole in spite of large dislocation-undetectable areas.

According to the invention, in the metal silicide target material whose relative density is adjusted to a high density not less than 100%, it is possible to restrict the occurrence of fine particles (which restriction had been difficult in prior art) by either decreasing the hardness of free silicon portions or decreasing the amount of the dislocations existing in the free silicon portions.

Therefore, by using the target material of the invention, it becomes possible to significantly improve an yield on the production of semiconductor devices requiring fine manufacturing accuracy, and it is greatly useful in the field of industry.

What is claimed is:

1. A metal silicide target material having an atomic ratio Si/M of silicon to metal M which atomic ratio is more than 2, and a structure substantially comprising a metal silicide compound and free silicon portions, said target material having a relative density more than 100% which relative density is defined by a ratio of a true density of the target material to a theoretical density obtained by calculating on the assumption that the target material is constituted by both stoichiometric silicide $MSi_2$ of high melting point and pure silicon Si, said free silicon portions in the structure of the target material being provided with Vickers hardness less than 1,100.

2. A metal silicide target material set forth in claim 1, wherein Vickers hardness of said metal silicide portions in the structure of the target material is less than 1,200.

3. A metal silicide target material set forth in claim 2, wherein a scratching rupture load at which rupture occurs is not less than 50N in a case where a load is successively increased from zero N at a scratching rate of 10 mm/min. at a loading rate of 100N/min. by use of a diamond indenter used for Rockwell hardness A scale.

4. A metal silicide target material having an atomic ratio Si/M of silicon to metal M which atomic ratio is more than 2, and a structure substantially comprising a metal silicide compound and free silicon portions, said target material having a relative density more than 100% which relative density is defined by a ratio of a true density of the target material to a theoretical density obtained by calculating on the assumption that the target material is constituted by both stoichiometric silicide $MSi_2$ of high melting point and pure silicon Si, said free silicon portions in the structure of the target material being provided with dislocation-undetectable areas each having a diameter not less than 1 μm.

5. A metal silicide target material set forth in claim 4, wherein Vickers hardness of said free silicon portions in the structure of the target material is less than 1,100.

6. A metal silicide target material set forth in claim 4, wherein Vickers hardness of said metal silicide portions in the structure of the target material is less than 1,200.

7. A metal silicide target material set forth in claim 4, wherein a scratching rupture load at which rupture occurs is not less than 50N in a case where a load is successively increased from zero N at a scratching rate of 100 mm/min. at a loading rate of 100N/min. by use of a diamond indenter used for Rockwell hardness A scale.

8. A metal silicide target material set forth in claim 1, wherein the atomic ratio Si/M of silicon to metal M is not less than 2.5.

9. A metal silicide target material set forth in claim 1, wherein the atomic ratio Si/M of silicon to metal M is not greater than 4.

10. A metal silicide target material set forth in claim 1, wherein the atomic ratio Si/M of silicon to metal M is not less than 2.5 and not greater than 4.

11. A metal silicide target material set forth in claim 1, wherein the atomic ratio Si/M of silicon to metal M is 2.75.

12. A metal silicide target material set forth in claim 4, wherein the atomic ratio Si/M of silicon to metal M is not less than 2.5.

13. A metal silicide target material set forth in claim 4, wherein the atomic ratio Si/M of silicon to metal M is not greater than 4.

14. A metal silicide target material set forth in claim 4, wherein the atomic ratio Si/M of silicon to metal M is not less than 2.5 and not greater than 4.

15. A metal silicide target material set forth in claim 4, wherein the atomic ratio Si/M of silicon to metal M is 2.75.

* * * * *